United States Patent [19]
Takao et al.

[11] Patent Number: 5,721,077
[45] Date of Patent: Feb. 24, 1998

[54] PROCESS FOR PRODUCING A COLOR FILTER

[75] Inventors: Hideaki Takao, Sagamihara; Kazuya Ishiwata, Yokosuka; Noriyuki Nakai, Ayase; Naoya Nishida, Hadano; Tatsuo Murata, Hiratsuka, all of Japan

[73] Assignee: Canon Kabushiki Kaisha, Tokyo, Japan

[21] Appl. No.: 475,532

[22] Filed: Jun. 7, 1995

Related U.S. Application Data

[62] Division of Ser. No. 246,559, May 19, 1994, which is a continuation of Ser. No. 792,931, Nov. 15, 1991, abandoned.

[30] Foreign Application Priority Data

Nov. 16, 1990 [JP] Japan ................. 2-308721
Dec. 19, 1990 [JP] Japan ................. 2-403555

[51] Int. Cl.$^6$ ................. G03F 9/00; G03C 1/725
[52] U.S. Cl. ................. 430/7; 430/270.1; 430/283.1; 430/292; 430/293; 430/294
[58] Field of Search ................. 430/270, 283, 430/292, 293, 294, 7, 270.1, 283.1

[56] References Cited

U.S. PATENT DOCUMENTS

| | | | |
|---|---|---|---|
| 4,307,135 | 12/1981 | Fox | 521/64 |
| 4,383,017 | 5/1983 | Hirofumi et al. | 430/293 |
| 4,710,200 | 12/1987 | Cates et al. | 8/574 |
| 4,802,743 | 2/1989 | Takao et al. | 350/339 F |
| 4,877,653 | 10/1989 | Vora et al. | 528/352 |
| 5,250,214 | 10/1993 | Kanemoto et al. | 252/299.1 |

FOREIGN PATENT DOCUMENTS

| | | |
|---|---|---|
| 60-16407 | 1/1982 | Japan . |
| 57-74707 | 5/1982 | Japan . |
| 58-046325 | 3/1985 | Japan . |
| 60-078401 | 4/1985 | Japan . |
| 60-129707 | 7/1985 | Japan . |
| 60-184202 | 9/1985 | Japan . |
| 60-184203 | 9/1985 | Japan . |
| 60-184204 | 9/1985 | Japan . |
| 60-184205 | 9/1985 | Japan . |
| 60-218902 | 9/1986 | Japan . |
| 63-191104 | 8/1988 | Japan . |

*Primary Examiner*—Mark Chapman
*Attorney, Agent, or Firm*—Fitzpatrick, Cella, Harper & Scinto

[57] ABSTRACT

A photosensitive colored material mainly composed of an aromatic polyamide or polyimide resin having a photosensitive group in its molecule, a coloring matter, and a solvent, wherein; said solvent comprises a first solvent component capable of independently dissolving said resin alone and a second solvent component having a smaller surface tension than said first solvent component and incapable of independently solving said resin; and the content of said first solvent component is larger than the content of said second solvent component.

10 Claims, 7 Drawing Sheets

PROCESS FOR PRODUCING A COLOR FILTER

This application is a division of application Ser. No. 08/246,559, filed May 19, 1994, which is a continuation of application Ser. No. 07/792,931, filed Nov. 15, 1991, now abandoned.

BACKGROUND OF THE INVENTION

1. Field of the Invention

The present invention relates to a photosensitive colored resin composition used when a color filter is formed. More particularly, it relates to a photosensitive colored resin composition that forms a color filter suitable for fine color separation useful in color image pickup devices, color sensors, color display devices, etc.

2. Related Background Art

Dyed color filters are hitherto known which are comprised of a substrate and provided thereon a mordant layer comprising a hydrophilic polymeric substance such as gelatin, casein, glue or polyvinyl alcohol, which mordant layer is dyed with a coloring matter to form a colored layer.

In such a dyeing method, usable dyes are available in a great variety and hence the spectral characteristics required for color filters can be relatively easily achieved. In the step of dyeing the mordant layer, however, this method employs a wet process which is difficult to control, such that the mordant layer is immersed in a dyeing bath in which a dye has been dissolved. This method has also the disadvantage that it has a complicated process wherein intermediate layers for resist printing are provided for the respective colors, and hence may give a poor yield. It has still also the disadvantages that the coloring matters feasible for the dyeing have a relatively low heat resistance as being resistant to a temperature of about 150° C. or less and hence they are difficult to handle when a thermal treatment must be applied to the filter, and also that the dyed film itself has a poor reliability for its heat resistance, light-resistance, etc.

To overcome such disadvantages, color filters are conventionally known which make use of a colored resin comprising a certain kind of coloring material dispersed in a transparent resin.

For example, Japanese Patent Applications Laid-open No.58-46325, No. 60-78401, No. 60-184202, No. 60-184203, No. 60-184204, No. 60-184205, etc., disclose a color filter characterized by a colored resin film comprising a polyamino resin such as polyamide resin or polyimide resin in which a coloring material is mixed. According to this color filter, the polyamino resin itself is a non-photosensitive resin, though excellent in the properties such as heat resistance and light-resistance, and hence the pattern of the color filter must be formed by print coating that is disadvantageous for the formation of fine patterns, or by a method comprising complicated production steps such that a mask comprised of a resist is provided on a colored resin film and thereafter the colored resin film is etched.

In recent years, coloring agents making use of a polyimide resin having photosensitive properties are used. This resin is a polyimide precursor, and has had to be heat-cured usually at 300° C. or above before it is formed into an imide.

In the meantime, Japanese Patent Applications Laid-open No. 57-16407, No. 57-74707, No. 60-129707 disclose a color filter comprising a colored resin film formed of a photosensitive resin and a coloring agent mixed therein. According to this color filter, a fine pattern can be formed only by photolithography which is commonly available for methods of preparing color filters, and hence its preparation process can be simplified. However, those commonly used as the photosensitive resin must be prepared by mixing a resin film material and a photosensitive curing agent, which is accompanied by troublesomeness, or can not be well satisfactory in the properties such as heat resistance and light-resistance.

To overcome such disadvantages, the present applicant has already disclosed in Japanese Patent Application Laid-open No. 62-218902 that a fine pattern can be formed and also a color filter excellent in mechanical properties as well as the properties such as heat resistance, light-resistance and solvent resistance can be provided by a simple preparation process, using a photosensitive colored resin composition comprising a heat-resistant photosensitive polyamide resin or polyimide resin and a coloring matter, an additive, a solvent, etc.

In general, basic polar solvents are used as solvents for aromatic polyamide resins or polyimide resins from the viewpoint of their solubility. Accordingly, also in the photosensitive colored resin composition for color filters, making use of such resins, a polar solvent is usually used as the solvent, serving as a constituent of the composition.

However, the photosensitive colored resin composition for color filters, comprised of such a solvent system, has not been well satisfactory in view of leveling properties (or flatness) required when the composition is coated on a substrate, or in view of coloring matter density non-uniformity that may occur when the coating is carried out. In particular, in recent years, these problems on coating quality levels have become serious because of a tendency toward a larger substrate on which the color filter is formed, and also because of use of ink transfer coating carried out using a roller coater, a printer or the like.

Such a poorness in coating quality level not only makes the performances of devices poor, but also causes occurrence of defects in color filters on account of coating non-uniformity even when the color filters are formed using the photosensitive colored resin composition. This has a great influence on the yield, and has become an important problem.

As for the case in which a color filter is formed using a colored resin obtained by mixing a coloring material in a photosensitive resin as previously described, exposure energy necessary for the photocuring of the photosensitive resin is fairly greater than that in usual instances because the coloring material itself usually has light-absorption in the exposure wavelength region.

In general, the light intensity at the time the photosensitive resin is exposed to light decreases in exponential function order as the light enters in the depth direction from the surface irradiated with light. Hence, the additional mixing of the coloring material having light-absorption properties, in the photosensitive resin makes very large the attenuation of the intensity of incident light at the time the resin is exposed to light, with respect to the depth direction from the surface irradiated with light. In some instances, this results in an insufficient photocuring in the vicinity of the interface between the photosensitive colored resin film and the substrate coming into contact with the bottom thereof, to cause peel-off or the like when developing is carried out.

In addition, the coloring material itself is sometimes deteriorated if the exposure energy is unusually enlarged in order to compensate this attenuation of the intensity of incident light at the time of the exposure.

Moreover, the colored resin film surface is roughed because of the inclusion of the coloring material to cause scattering of light at the color filter surface, sometimes resulting in not only a fall of optical performance of the color filter, but also a disturbance of alignment of liquid crystal molecules when the inner surface of a liquid crystal display device is constituted of such a color filter.

Thus, in the case when the color filter is formed using the colored resin obtained by mixing a coloring material in a photosensitive resin, problems are remain unsettled in respect of the stability of color filters in that process, the durability, and the performances required for color filters.

In order to eliminate the above disadvantages, there has been filed a patent application, Japanese Patent Application No. 62-22461 (Japanese Patent Application Laid-open No. 63-191104) to propose a color filter that enables efficient formation of a pattern with use of a smaller exposure energy, and also can prevent the coloring material itself from deteriorating at the time of exposure, can decrease photo-curing non-uniformity in the depth direction of the film and can give a colored resin film having a smoother surface state. This color filter is a color filter making use of a colored resin obtained by dispersing at least a coloring material in a photosensitive resin, and having a plurality of patternwise colored resin layers formed by repeating photolithography, wherein the coloring material is dispersed in a quantity gradually increasing from the surface to bottom of the colored resin layer.

To form the above color filter on a substrate, the colored resin obtained by dispersing at least a coloring material in a photosensitive resin is used, and patterning is carried out by photolithography. This patterning is usually carried out by first coating a substrate with the colored resin film using a coating method such as spin coating, print coating, roll coating or the like, and thereafter provisionally curing (prebaking) the colored resin using a clean oven hot plate or the like, followed by exposure through a photomask and developing to form a pattern of the color filter.

However, in the instance where the spin coating is used in the coating to form the color filter by the use of the photosensitive colored material described above, a portion with a thick pigment component may be formed at the center. This is unfavorable for color filters. For example, in the case when the color filter is used in a liquid crystal display, a portion with a high density may appear at the center of a screen and it is not necessarily possible to avoid an extremely poor display quality level. In the case of display using a ferroelectric liquid crystal, there is the problem that the protrusion at the center influences the cell gap. (The protrusion at the center is at least 3,000 angstroms higher than the area around it, and the ferroelectric liquid crystal device has a cell gap of 1.5 μm or less).

SUMMARY OF THE INVENTION

A first object of the present invention is to provide a photosensitive colored resin composition for color filters, that can eliminate the disadvantages involved in the prior art, can form a coating film with a superior coating quality level when coated, and can form a fine pattern with less defects by a simple production process; and a color filter formed using such a composition.

A second object of the present invention is to provide a color filter having a uniform pigment density and also a uniform layer thickness, and a photosensitive colored resin composition used for such a color filter.

The above objects and others are accomplished in accordance with a first aspect of the present invention by providing a photosensitive colored resin composition for a color filter, mainly composed of an aromatic polyamide or polyimide resin having a photosensitive group in its molecule, a coloring matter, an additive and a solvent, wherein;

said solvent comprises a first solvent component capable of independently dissolving said resin alone and a second solvent component having a smaller surface tension than said first solvent component and incapable of independently solving said resin;

and the content of said first solvent component is larger than the content of said second solvent component.

According to the first aspect of the present invention, the second solvent having a smaller surface tension is mixed in the range of amounts that may little influence the solubility of the resin and other performances required for the photosensitive colored resin composition. This makes it possible to ensure the leveling properties required when the composition is coated, to prevent coloring matter density non-uniformity from occurring, and to form a color filter with a superior coating quality level.

According to a second aspect of the present invention, there is provided a photosensitive colored material comprising a main component polyamide resin, a pigment dispersed in said polyamide resin, and N-methyl-2-pyrrolidone as a solvent; said photosensitive colored material being incorporated with γ-butyrolactone as a leveling material.

BRIEF DESCRIPTION OF THE PREFERRED EMBODIMENTS

Figure 1:
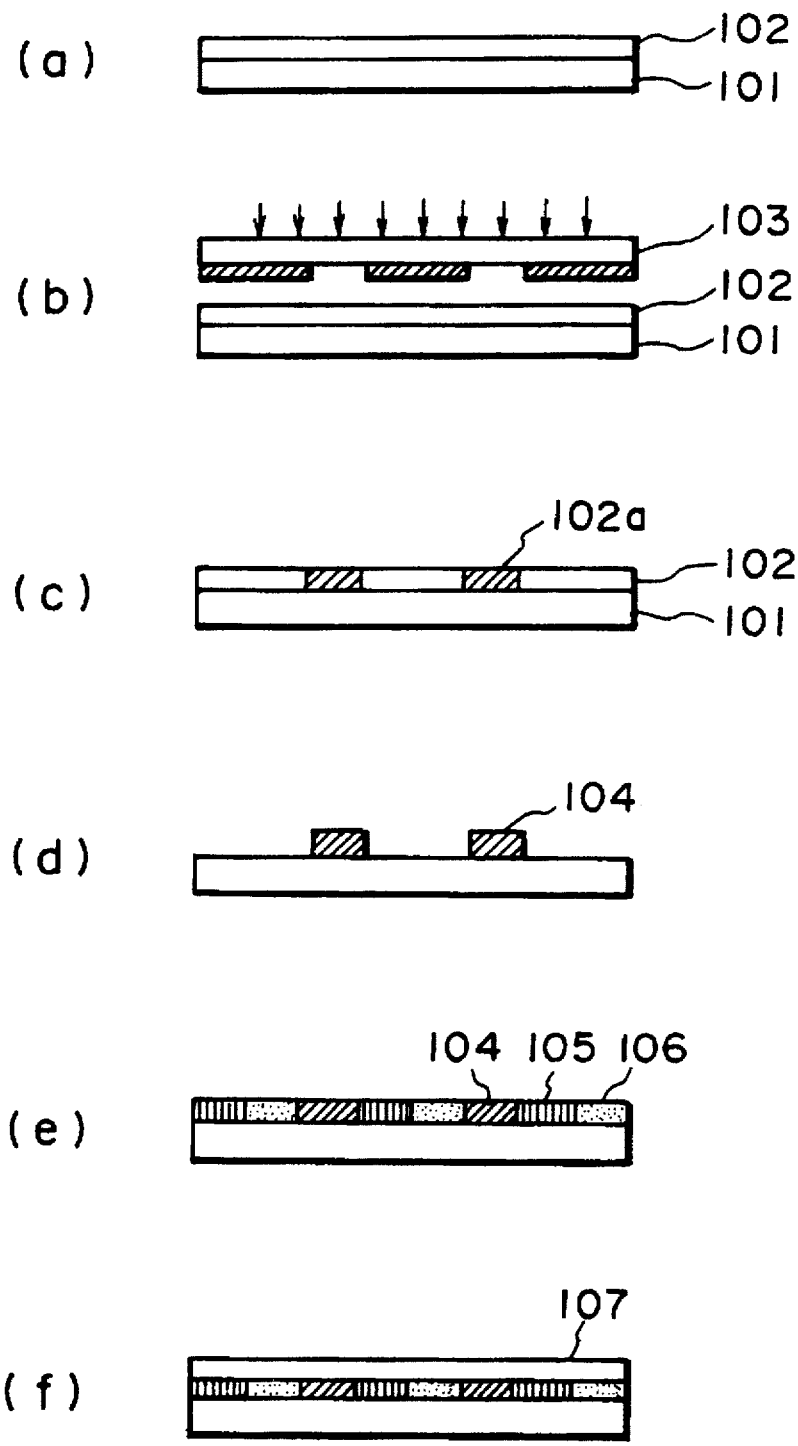
FIGS. 1(a) to 1(f) show a flow chart to illustrate a method of forming a color filter making use of the photosensitive colored resin composition for color filters according to the first embodiment of the present invention.

In the first aspect of the present invention, the aromatic polyamide resin or polyimide resin having a photosensitive group in its molecule may preferably be those capable of giving a cured film at a temperature of 200° C. or below, and particularly those having no specific light absorption characteristics in the visible light wavelength region (400 to 700 nm) (or those of about 90% or more in light transmittance). From this point of view, an aromatic polyamide resin is particularly preferred.

In the present invention, the photosensitive group (a group having photosensitivity) may be an aromatic chain having a photosensitive unsaturated hydrocarbon group as shown below, including, for example, the following:

(1) Benzoic acid esters:

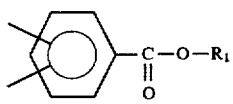

wherein $R_1$ represents CHX=CY—COO—Z—, X represents —H or —$C_6H_5$, Y represents —H or —$CH_3$, and Z represents a single bond, an ethyl group or a glycidyl group.

(2) Benzyl acrylates:

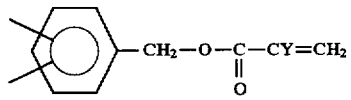

wherein Y represents —H or —$CH_3$.

(3) Diphenyl ethers:

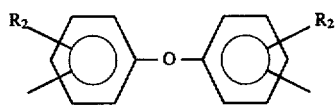

wherein $R_2$ represents a group containing at lease one CHX=CY—CONH—, CH2=CY—COO—(CH2)2—OCO or CH2=CY—COO—CH2—, and X and Y each represent the same group as described above.

(4) Chalcones and other compound chains:

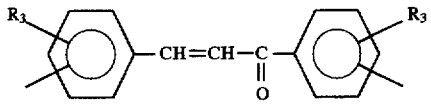

wherein $R_3$ represents H—, an alkyl group or an alkoxyl group.

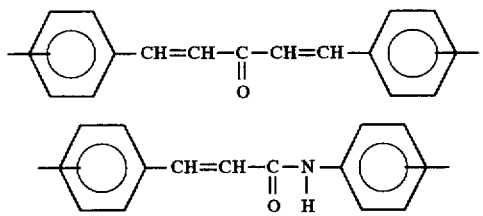

The aromatic polyamide resin or polyimide resin having any of these groups in its molecule can be exemplified by LITHOCOAT PA-100 (trade name; available from Ube Industries, Ltd.), LITHOCOAT PI-300 (trade name; available from Ube Industries, Ltd.) and LITHOCOAT PI-400 (trade name; available from Ube Industries, Ltd.).

Few photosensitive resins commonly used in photolithography are excellent in mechanical properties, as well as in durability such as heat resistance, light-resistance or solvent resistance, although different depending on their chemical structures. On the other hand, the photosensitive polyamino resins of the present invention, described above, are resins superior in such durability as will be evident from their chemical structures. The color filter formed using any of these can also have very good durability.

In the first aspect of the present invention, the solvent components are comprised of the first solvent component mainly having the function of dissolving the resin and the second solvent component mainly having the function of improving coating quality level.

The first solvent component may be those capable of independently dissolving the resin as exemplified by N-methyl-2-pyrrolidone (surface tension γ: 41 dyne/cm, 25° C.); "Solvent "Handbook", Kodansha Scientific Co.), N,N-dimethylformamide (γ: 35.2 dyne/cm, 25° C.), N,N-dimethylacetamide (γ: 32.4 dyne/cm, 30° C.), dimethylsulfoxide (γ: 42.9 dyne/cm, 25° C.), and hexamethylsulfonamide (γ: 33.8 dyne/cm, 20° C.).

The second solvent component is selected from those very hardly capable of solving the resin when used alone, having a smaller surface tension and having a good compatibility with the photosensitive colored resin composition containing the first solvent component. It may include, for example, ethylene glycol monomethyl ether (available as methyl cellosolve; surface tension γ: 31.8 dyne/cm, 14.9° C.), ethylene glycol monoethyl ether (available as ethyl cellosolve; γ: 28.2 dyne/cm, 25° C.), ethylene glycol monoethyl ether acetate (available as ethyl cellosolve acetate; γ: 31.8 dyne/cm, 25° C.), ethylene glycol monobutyl ether (available as butyl cellosolve; γ: 27.4 dyne/cm, 25° C.), diacetone alcohol (γ: 31.0 dyne/cm, 20° C.), diethylene glycol monoethyl ether (available as ethyl carbitol; γ: 31.8 dyne/cm, 25° C.) and diethylene glycol dimethyl ether (available as diglyme; γ: 29.5 dyne/cm, 25° C.).

To compose these first solvent component and second solvent component, a suitable combination may be selected from the range of "surface tension of first solvent component>surface tension of second solvent component" and also "amount of first solvent component used>amount of second solvent component".

If a solvent with a larger surface tension than the first solvent component is added as the second solvent component, no improvement of coating quality level can be brought about. With an increase in component proportion for the second solvent component, the solubility to resin may become deteriorated to affect the characteristics required for a photosensitive colored resin, resulting in a material with a poor stability.

There are no particular limitations on the coloring matter used in the first aspect of the present invention, so long as they are those which can attain the desired spectral characteristics among organic pigments, inorganic pigments and dyes. In this instance, these materials may each be used alone or may be used in the form of a mixture of some of these. In the case when a dye is used, the performance of the color filter may be governed by the durability inherent in the dye itself. Use of the above resin system of the present invention, however, makes it possible to form a color filter having superior performance to that of conventional dyed color filters. Accordingly, organic pigments are most preferable as the coloring material taking account of the color characteristics and various performances of color filters.

The organic pigment may include azo pigments of a soluble azo type, an insoluble azo type or a condensed azo type, as well as phthalocyanine pigments, and condensed polycyclic pigments including those of an indigo type, an anthraquinone type, a perylene type, a perynone type, a dioxazine type, a quinacridone type, an isoindolinone type, a phthalone type, a methine or azomethine type or other metal complex type, any of which can be used alone or in the form of a mixture of some of these.

The additive used in the first aspect of the present invention may include, for example, conventional photopolymerization initiators or sensitizers used for accelerating photochemical reaction, conventional heat polymerization restrainers used for preventing dark reaction in curing reaction, conventional dispersants used for uniformly dispersing organic pigments, and conventional coupling agents used for improving adhesion to the substrate, any of which can be used.

In the photosensitive colored resin composition for color filters according to the first aspect of the present invention, the respective components may be mixed in such a proportion that the coloring matter is in an amount ranging from 10 to 100 parts by weight, and preferably from 30 to 90 parts by weight, the additive is in an amount ranging from 1 part by weight to 40 parts by weight, and preferably from 5 to 30 parts by weight, and the solvent is in an amount ranging from 1,000 to 2,000 parts by weight, and preferably from 1,200 to 1,800 parts by weight, based on 100 parts by weight of the aromatic polyamide resin or polyimide resin having a photosensitive group in its molecule.

In the first aspect of the present invention, the photosensitive colored resin composition can be prepared in the following way: The coloring matter having the desired spectral characteristics is mixed in a solution obtained by dissolving the aromatic polyamide resin or polyimide resin in the first solvent component in an amount of approximately from 10 to 100% by weight based on the resin. The resulting mixture is thoroughly dispersed using an ultrasonic means, a three-roll mill or a ball mill, and then particles with a size of 1 μm or larger may preferably be removed using a filter. Next, the second solvent component and the additives are added, followed by removal of foreign matters to give the end composition. In some instances, a method may be taken wherein only the second solvent component is added immediately before coating. In such instances, the second solvent component that is adverse to the solubility of the resin is not present in the photosensitive colored resin composition being stored, and hence this method is preferred from the viewpoint of stability.

Using the photosensitive colored resin composition according to the first aspect of the present invention, the color filter can be formed in the following way: The photosensitive colored resin composition is applied to a glass plate or sheet, a transparent resin plate or sheet, a resin film, a display surface of a cathode ray tube, a receptor surface of an image pick-up tube, a wafer on which a solid-state imaging device such as CCD, BBD, CID or BASIS is formed, a contact type image sensor making use of a thin-film semiconductor, a liquid crystal display surface, or a substrate of a color electrophotographic photosensitive member by means of a coating apparatus such as a spin coater, a roll coater or a printer, followed by photolithography to patternwise form the color filter. Its thickness depends on the desired spectral characteristics. It should be usually from about 0.5 to 5 μm, and preferably from about 1 to 2 μm.

The color filter described above is comprised of a good material having a satisfactory durability in itself. In particular, however, in order to better protect the colored resin layer from various environmental conditions, the surface of the colored resin layer may be provided as a protective layer with an organic resin film comprising polyamide, polyimide, polyurethane, polycarbonate, silicone or the like, or an inorganic film comprising $Si_3N_4$, $SiO_2$, $SiO$, $Al_2O_3$, $Ta_2O_3$ or the like, by coating such as spin coating, roll coating or print coating or by vacuum deposition.

A typical method of forming a color filter making use of the photosensitive colored resin composition according to the first aspect of the present invention will be described below with reference to drawings.

FIGS. 1(a) to 1(f) show a flow chart to illustrate a method of forming a color filter. First, as shown in FIG. 1(a), on a given substrate 101, a first-color colored resin film 102 is formed by coating using a roll coater in a given layer thickness, making use of a polyamide resin or polyimide resin (an N-methyl-2-pyrrolidone (NMP)/ethyl cellosolve acetate solution) incorporated with a given amount of a coloring matter having the desired spectral characteristics, followed by prebaking under appropriate temperature conditions. Next, as shown in FIG. 1(b), the colored resin film is exposed to light (e.g., light of a high-pressure mercury lamp) to which the photosensitive colored resin has sensitivity, through a photomask having a given pattern form corresponding with the pattern to be formed, thereby effecting photo-curing of the pattern area.

Then, as shown in FIG. 1(c), the colored resin film 102 having the photo-cured area 102a is subjected to ultrasonic development using a solvent capable of solving only an unexposed area (e.g., a solvent mainly composed of N-methyl-2-pyrrolidone), followed by rinsing (using, e.g., isopropyl alcohol). Next, the film is post-baked. Thus a patternwise colored resin layer 104 of the present invention can be obtained.

In instances in which a color filter comprised of two or more colors is formed, the steps shown in FIGS. 1(a) to 1(d) may further be repeated as necessary, i.e., corresponding with the number of colors of the filter used, respectively using colored resin solutions in which coloring matters corresponding with the respective colors have been dispersed. Thus, for example, a three-color filter comprised of patternwise colored resin layers 104, 105 and 106 with different colors as shown in FIG. 1(e) can be formed.

The color filter according to the first aspect of the present invention may also be provided on its top surface with a protective layer 107 as shown in FIG. 1(f), formed of the material as previously described.

A preferred embodiment in accordance with the second aspect of the present invention will be described below.

The leveling material is commonly known to include nBC, ECA, NMP, butyl carbitol, hexylene glycol and propylene glycol. In the case when the coating is carried out by print coating, it is a conventional means to use any of the above materials having a high-boiling point so that a plate is not easily dried. However, what is in the first place required as the leveling material used in the present invention is that the state of dispersion of the pigment having been dispersed in the polyamide resin should not be impaired.

Figure 5:
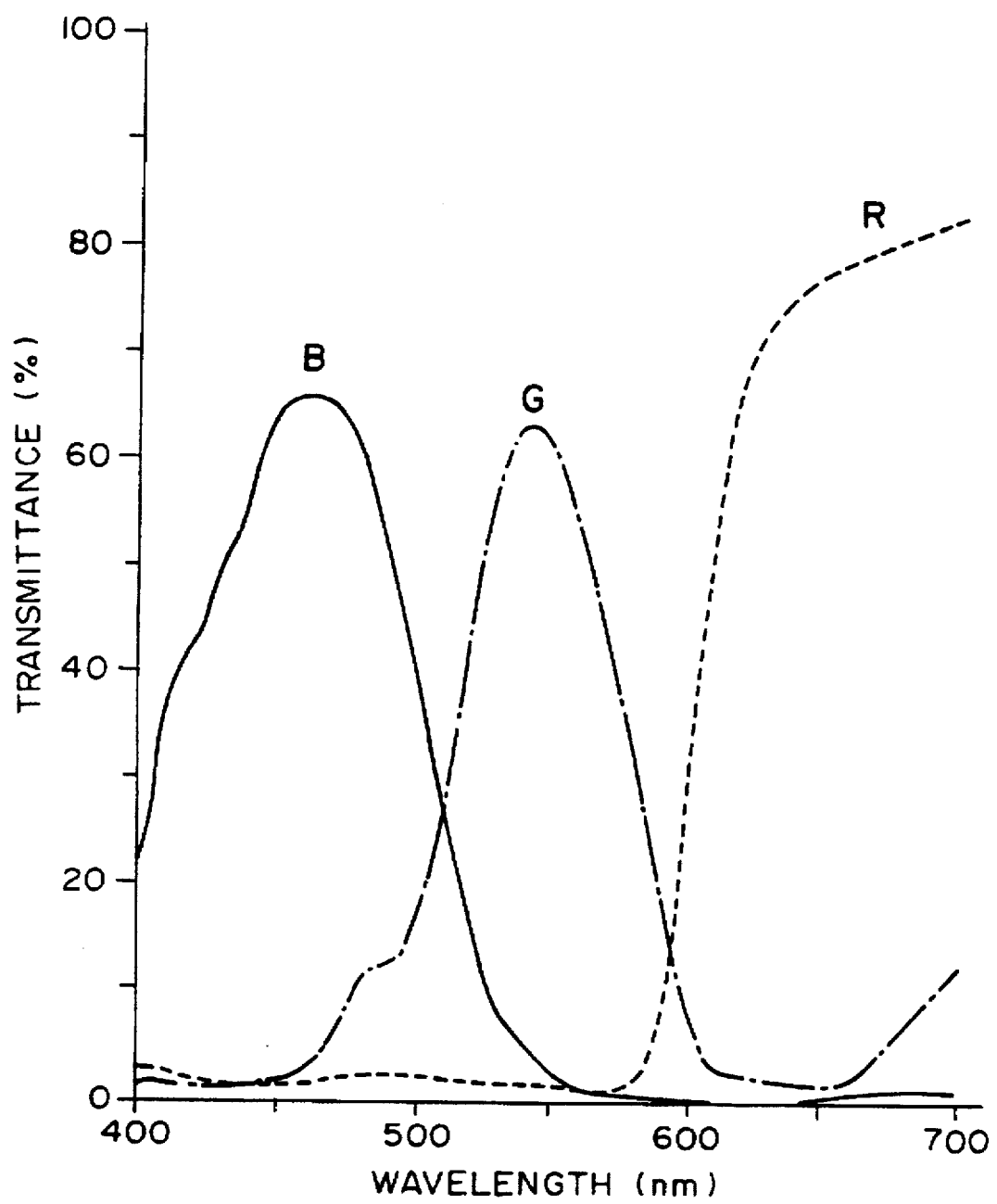
FIG. 5 is a graph to show spectral characteristics of a CRT.
Figure 6:
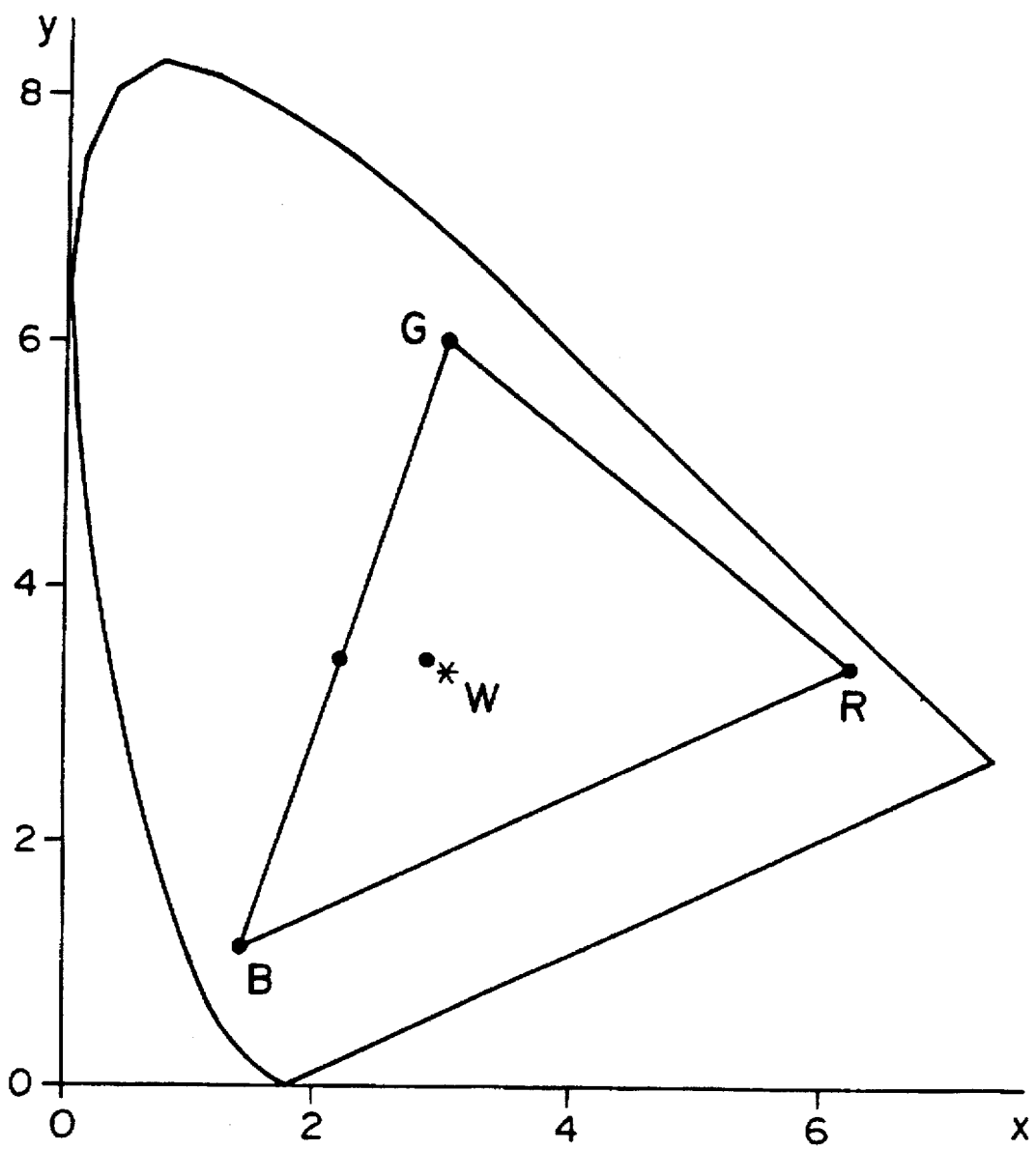
FIG. 6 is a chromaticity diagram of the CRT.

Taking account of orientation characteristics and operation of liquid crystals, the photosensitive colored material used in accordance with the second aspect of the present invention should also have substantially the same color characteristics, i.e., spectral characteristics as those of CRTs, shown in FIGS. 5 and 6, when coated in a thickness of 2.0 μm or less. The material that can satisfy all these requirements and eliminate any disadvantages is only γ-butyrolactone. The nBC and NMP, although bring about a certain improvement, have been confirmed to be unsatisfactory.

If, however, the γ-butyrolactone is less than 10%, its addition may be less effective. If it is more than 45%, no uniform coating can be carried out unless the amount of dropwise addition must be made extremely large when the composition is spin-coated. This is due to the fact that a mixture of the γ-butyrolactone and the photosensitive colored resin composition may cause a great degree of shrinkage and hence some part can not be coated unless the composition is dropwise added in a large quantity. Thus, as a result of experiments, the present inventors have found that the γ-butyrolactone should preferably be mixed in an amount of from 10 to 45% by weight.

As for the viscosity of the photosensitive colored resin composition used in the present invention, a viscosity less than 200 cPs can give no satisfactory countermeasure to the center when the composition is spin-coated, to make the disadvantages conspicuous. In the case when a ferroelectric liquid crystal device is used, the viscosity should be not less than 200 cPs, and preferably not less than 450 cPs, since its cell gap is small as previously stated.

Examples of the present invention will be given below.

EXAMPLE 1

In a blue-pigment solution (pigment: Heliogen Blue L7080, trade name, available from BASF Wyandott Corp., C. I. No. 74160; pigment content: about 10% by weight) prepared by previously dispersing the pigment in N-methyl-2-pyrrolidone (NMP), a photosensitive polyamide resin solution (PA-1000, trade name, available from Ube Industries, Ltd.; polymer content: about 10% by weight; solvent: N-methyl-2-pyrrolidone) were so mixed as to give a weight proportion of pigment:resin=1:2, end the mixture was thoroughly dispersed by ultrasonic dispersion. In the resulting solution, ethyl cellosolve acetate (ECA) was so mixed as to give a weight ratio of NMP:ECA=4:1. A photosensitive colored resin composition for blue color filters was thus obtained.

This colored resin composition was applied to a glass substrate by means of a roll coater in a layer thickness of 1.5 μm, followed by prebaking at 80° C. for 10 minutes.

The coating film thus formed had no serious surface irregularity, had hardly noticeable density non-uniformity of the pigment and had a superior coating quality level.

EXAMPLE 2

A coating film was formed in the same manner as in Example 1 except that the blue pigment was replaced with a green pigment, Lionol Green 6YK (trade name, available from Toyo Ink Mfg. Co., Ltd., C.I. No. 74265). The coating film thus formed had no serious surface irregularity, had hardly noticeable density non-uniformity of the pigment and had a superior coating quality level.

EXAMPLE 3

A coating film was formed in the same manner as in Example 1 except that the blue pigment was replaced with a red pigment, Irgazin Red BPT (trade name, available from Ciba-Geigy A G., C.I. No. 77127). The coating film thus formed had no serious surface irregularity, had hardly noticeable density non-uniformity of the pigment and had a superior coating quality level.

EXAMPLE 4

A photosensitive colored resin composition for blue color filters was obtained in the same manner as in Example 1 except that the ethyl cellosolve acetate was replaced with buryl cellosolve (nBC) which was so mixed as to be in a ratio of NMP:butyl cellosolve=9:1.

Using this colored resin composition, coating was carried out by utilizing a printer for oriented films.

The coating film thus formed had no serious surface irregularity, had hardly noticeable density non-uniformity of the pigment and had a superior coating quality level.

EXAMPLE 5

Using respectively the blue color filter photosensitive colored resin composition obtained in Example 1, the green color filter photosensitive colored resin composition obtained in Example 2 and the red color filter photosensitive colored resin composition obtained in Example 3, a three-color filter was formed in the following way.

First, using the blue photosensitive colored resin composition, a glass substrate was coated with it by print coating in a layer thickness of 1.5 μm, followed by prebaking at 80° C. for 10 minutes. Next, the resulting coating film was exposed to light using a high-pressure mercury lamp through a pattern mask having a pattern form corresponding with the pattern to be formed. After the exposure was completed, the film was developed using a developing solution (a developing solution mainly composed of N-methyl-2-pyrrolidone) exclusively used for dissolving the unexposed area of the colored resin film, under application of ultrasonic waves, and then the developed film was rinsed using a rinsing solution (a rinsing solution mainly composed of isopropyl alcohol) exclusively used therefor, followed by post-baking at 200° C. for 30 minutes to form a blue colored resin film having a pattern form. During the developing, any defects that might be caused by coating non-uniformity did not occur at all.

Subsequently, on the glass substrate on which a blue colored pattern had been thus formed, a green colored pattern was formed at a given area on the substrate in the same manner as in the above except for using a second color, green photosensitive colored resin composition.

On the substrate on which the blue and green patterns had been thus formed, a red colored pattern was formed at a given area on the substrate in the same manner as in the above except for using a third color, red photosensitive colored resin composition. Thus a colored pattern with three-color stripes of R (red), G (green) and B (blue) was obtained.

Figure 2:
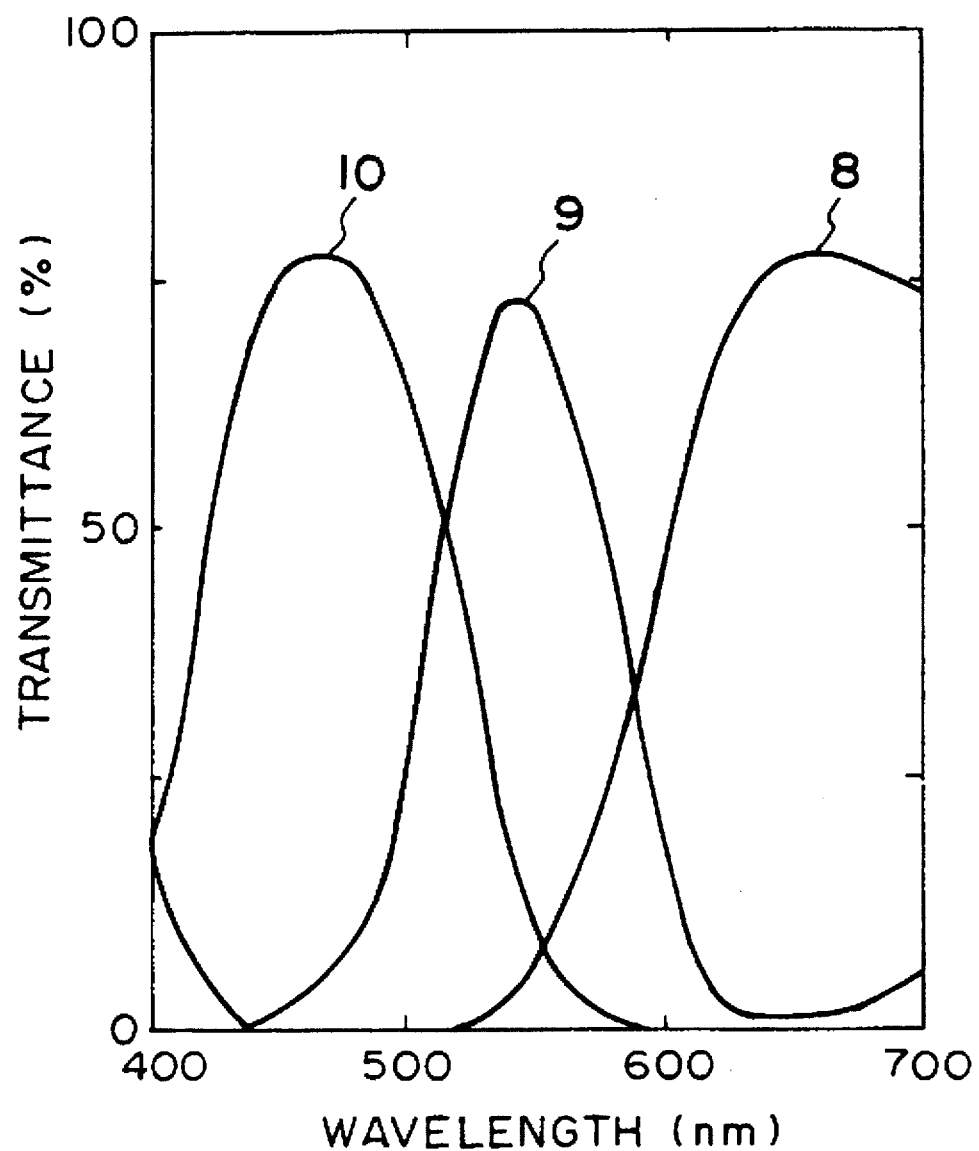
FIG. 2 is a graph to show spectral transmittance of a color filter obtained in Example 5.

Spectral characteristics of the color filter with three-color stripes formed in this way are shown in FIG. 2.

The color filter obtained had a superior quality such that it showed less scattering of color characteristics, had less roughness or unevenness on the surface, and also was free from any defects that might be caused by coating non-uniformity.

COMPARATIVE EXAMPLE 1

A coating film was formed in the same manner as in Example 1 except that ethyl cellosolve acetate was not used at all. The coating film thus obtained had a conspicuous dye density non-uniformity and had a poor coating quality level.

COMPARATIVE EXAMPLE 2

A coating film was formed in the same manner as in Example 1 except that the ratio of NMP:ECA was changed to 1:1. The coating film thus formed not only had a poor quality level but also made the photosensitive colored resin composition itself unstable.

COMPARARIVE EXAMPLE 3

A color filter with three-color stripes was obtained in the same manner as in Example 5 except that ethyl cellosolve acetate was not used at all. The color filter thus obtained showed a large variance of color characteristics and also had a conspicuous dye density non-uniformity. Moreover, a coating non-uniformity caused defects such as peel-off and under-developing residue that were considered to have occurred during the patterning. Thus, the product had a quality inferior to that of Example 5.

EXAMPLE 6

Examples of the color filter prepared using photosensitive colored resin composition according to the second aspect of the present invention will be shown.

First, 21 grams each of red, green and blue photosensitive colored polyamide resin materials with a viscosity of 500 cPs (PA-1012R, PA-1012G and PA-1012B, respectively, available from Ube Industries, Ltd.) were collected. To each of them, 9 grams (30% by weight) of γ-butyrolactone was added to give a composition of 30 grams in total weight. The resin composition thus prepared was stirred for about 5 minutes, and the resulting composition was dropwise added onto a glass substrate and coated by spin coating in a layer thickness of about 1.8 μm. Next, this coated substrate was prebaked on a hot plate of 85° C. for 10 minutes to evaporate the solvent component. A colored resin film thus formed had a uniform layer thickness over the whole surface and its center was free from a dense portion where the pigment component was densely present. Next, this prebaked substrate was subjected to usual photolithographic process comprising the steps of exposure, developing, rinsing and post-baking, to form a color filter pattern with a layer thickness of from about 1.7 to 1.6 μm. Then, a protective layer comprising a photosensitive polyamide resin (PA-1000C, available from Ube Industries, Ltd.) was laminated to the color filter patterns in a thickness of about 2 μm.

Figure 3:
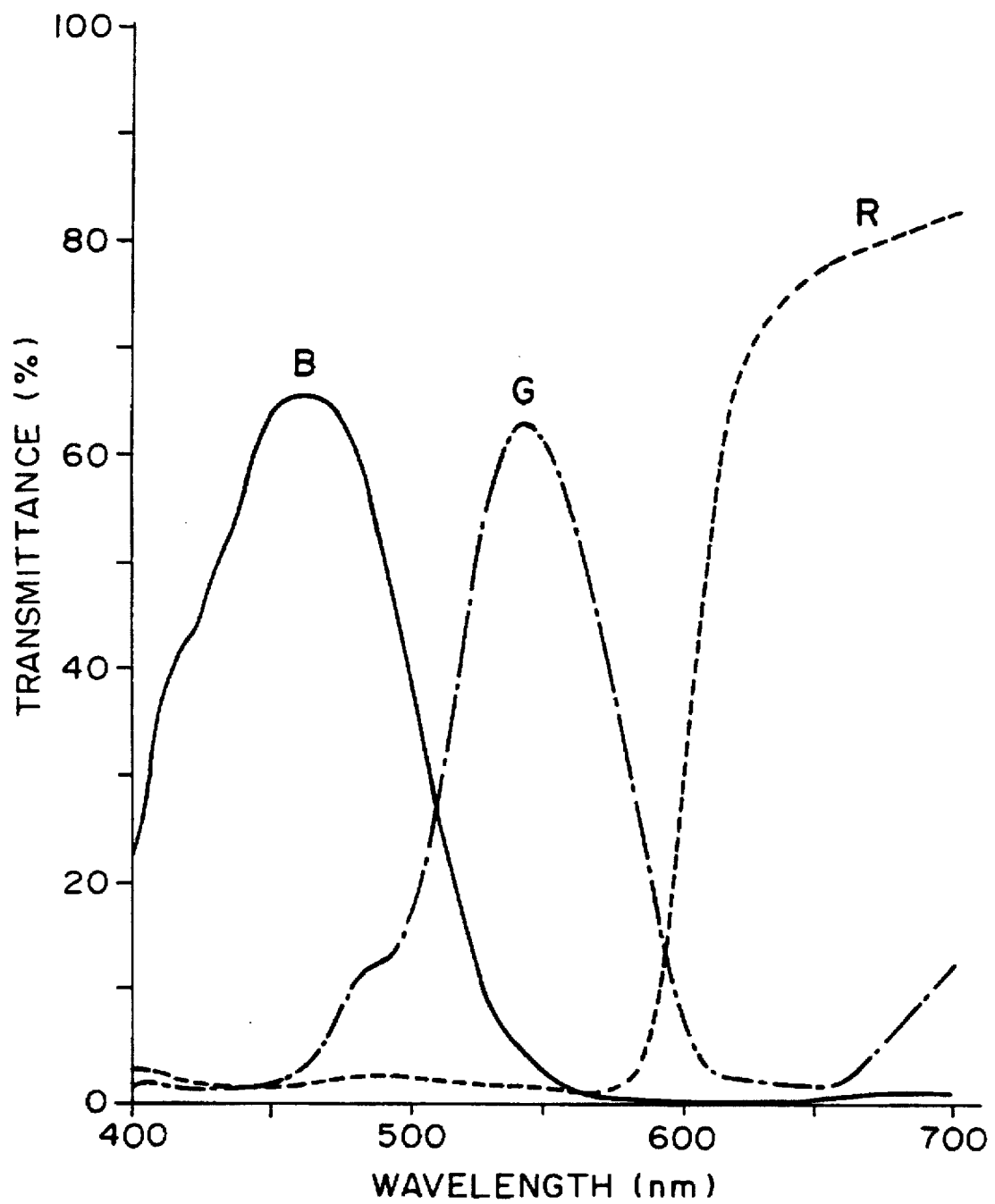
FIG. 3 is a graph to show an example of spectral characteristics of display making use of the second embodiment of the present invention.
Figure 4:
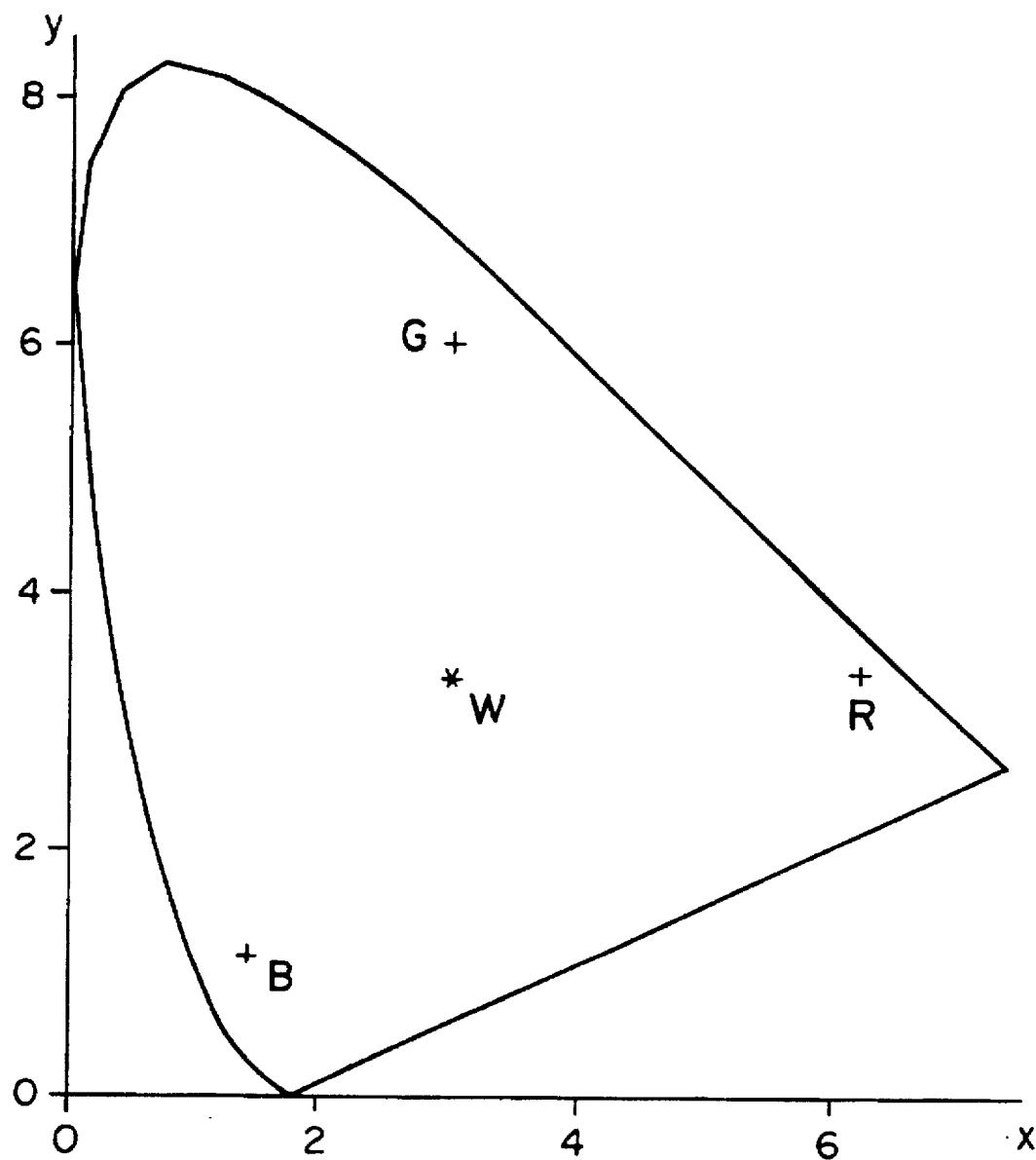
FIG. 4 is a chromaticity diagram of what is shown in FIG. 3.

On the substrate on which the color filter patterns had been formed, an ITO (indium-tin oxide) electrode pattern was further formed. Thereafter, the step of fabricating a liquid crystal cell, the step of injecting liquid crystal and the step of sealing the cell were carried out to give a color liquid crystal cell. This color liquid crystal cell was free from protrusion at the center, and hence it was possible to obtain a uniform cell pap of about 1.5 μm over the whole area. Color characteristics of the liquid crystal cell thus obtained are shown in FIGS. 3 and 4. As will be seen from comparison with those shown in FIGS. 5 and 6, the color characteristics shown in FIGS. 3 and 4 were found to be very good.

EXAMPLE 7

First, 24 grams each of red, green and blue photosensitive colored polyamide resin materials with a viscosity of 500 cPs (PA-1012R, PA-1012G and PA-1012B, respectively, available from Ube Industries, Ltd.) were collected. To each of them, 6 grams of γ-butyrolactone was added to give a composition of 30 grams in total weight. The resin composition thus prepared was stirred for about 5 minutes, and the resulting composition was dropwise added onto a glass substrate and coated by spin coating in a layer thickness of about 1.8 μm. Next, this coated substrate was prebaked on a hot plate of 85° C. for 10 minutes to evaporate the solvent component. A colored resin film thus formed had at its center a slight protrusion where the pigment component was densely present, but it was possible to control this protrusion to a height of about 500 angstroms compared with its surrounding area.

Next, this prebaked substrate was subjected to usual photolithographic process comprising the steps of exposure, developing, rinsing end post-baking, to form a color filter pattern with a layer thickness of from about 1.7 to 1.6 μm. Then, a protective layer comprising a photosensitive polyamide resin (PA-1000C, available from Ube Industries, Ltd.) was laminated to the color filter patterns in a thickness of about 2 μm.

On the substrate on which the color filter patterns had been formed, an ITO electrode pattern was further formed. Thereafter, the step of fabricating a liquid crystal cell, the step of injecting liquid crystal and the step of sealing the cell were carried out to give e color liquid crystal cell. Even though this color liquid crystal cell had protrusion of about 500 angstroms at the center, it was possible to obtain a uniform cell gap of about 1.5 μm over the whole area. Thus, the present invention was confirmed to be clearly effective compared with a conventional one to which no leveling agent was added.

EXAMPLE 8

Figure 7:
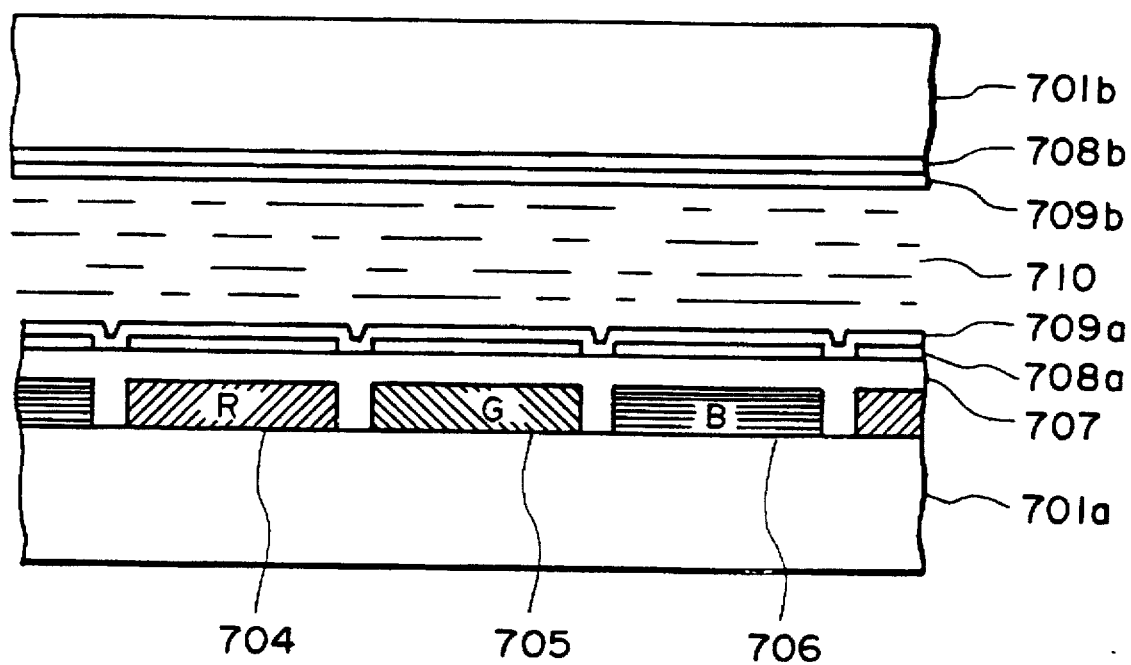
FIG. 7 is a diagrammatic cross section of a liquid crystal device having a color filter formed of the photosensitive colored resin composition according to the present invention.

FIG. 7 is a diagrammatic cross section to illustrate an example of the liquid crystal cell having the color filter formed using the photosensitive colored resin composition of the present invention. In FIG. 7, reference numerals 701a and 701b denote a lower substrate and an upper substrate, respectively; 704, 705 and 706 denote three kinds of color filter patterns with central wavelengths corresponding to red, green and blue, respectively, disposed on the lower substrate 701a correspondingly with picture elements; and 707, a protective layer. On the protective layer 707, a stripelike transparent electrode 708a, and further thereon an insulating film 709a serving also as an aligning film is provided.

The upper substrate 701b is provided with a stripelike transparent electrode 708b in such a way that it falls at right angles with the above stripelike transparent electrode 708a. A liquid crystal 710 is disposed between the upper and lower substrates. In the present examples, a ferroelectric liquid crystal was used as the first solvent component 710.

A liquid crystal cell with the constitution as described above was fabricated and image display was performed. As a result, it was possible to obtain a good image, being free from the problems as involved in the prior art.

As having been described above, according to the first aspect of the present invention, the second solvent component with good leveling properties is mixed in the photosensitive colored resin composition for color filters, and hence a coating film with a superior coating quality level can be formed particularly when the coating is carried out by transfer of ink. This has also made it possible to eliminate the defects in color filters that may be caused by coating non-uniformity, and at the same time to provide color filters with a good productivity.

In addition, this second solvent component is so mixed as to be in a smaller amount than the first solvent component in which the resin has been dispersed, and hence does not greatly affect the fundamental properties, stability, etc. inherent in the photosensitive colored resin composition.

Thus, it has become possible to prepare a color filter with fine patterns that is excellent in mechanical strength and also excellent in the properties such as heat resistance, light-resistance and solvent resistance, using the photosensitive colored resin composition that can be readily prepared and using a simple production process of photolithography only. That is to say, it has become possible to apply the color filter to comprehensive various devices that require color filters with a good performance, and also it has become possible to manufacture color devices having excellent various properties.

According to the second embodiment of the present invention, the γ-butyrolactone is mixed as a leveling material in the photosensitive colored resin composition comprising a main component polyamide resin, a pigment dispersed therein and a N-methyl-2-pyrrolidone used as a solvent. The resulting mixture is formed into a film by spin coating, which is then formed to have a color filter pattern by photolithography. The pattern thus obtained is free from the thick portion where the pigment component is localllized at the center, and has superior properties. The color liquid crystal cell obtained by the cell fabrication process has a uniform cell gap, and is very effective for achieving color liquid crystal display with superior display quality level.

The liquid crystal cell having the color filter formed of the photosensitive colored resin composition according to the first or second embodiment of the present invention enables good image display.

We claim:

1. A process for producing a color filter comprising the steps of:

dissolving a resin and a colorant comprising a pigment in a first solvent component to prepare a colored resin solution;

adding to the colored resin solution a second solvent component having a smaller surface tension than the first solvent component and being incapable of independently dissolving the resin such that the content of the first solvent component is larger than the content of the second solvent component; and coating a substrate with the colored resin solution immediately after the second solvent component is added to the colored resin solution.

2. The process according to claim 1, wherein the resin is a photosensitive polyamide resin.

3. The process according to claim 2, wherein the photosensitive polyamide resin is capable of being cured at a temperature of 200° C. or below.

4. The process according to claim 2, wherein the photosensitive polyamide resin has no specific photoabsorption within a wavelength range of 400–700 nm.

5. The process according to claim 1, wherein the resin is a photosensitive polyimide resin.

6. The process according to claim 5, wherein the photosensitive polyimide resin is capable of being cured at a temperature of 200° C. or below.

7. The process according to claim 5, wherein the photosensitive polyimide resin has no specific photoabsorption within a wavelength range of 400–700 nm.

8. The process according to claim 1, further comprising the step of incorporating γ-butyrolactone into the dispersion as said second solvent component.

9. The process according to claim 8, wherein the incorporated amount of γ-butyrolactone is 10 to 45% by weight.

10. The process according to claim 1, wherein the content of said second solvent component is 10 to 45% by weight of said dispersion.

\* \* \* \* \*